(12) United States Patent
Kim et al.

(10) Patent No.: US 9,117,952 B2
(45) Date of Patent: Aug. 25, 2015

(54) FRONT SHEET OF SOLAR CELL, METHOD OF MANUFACTURING THE SAME AND PHOTOVOLTAIC MODULE COMPRISING THE SAME

(75) Inventors: Hyun Cheol Kim, Daejeon (KR); Moon Soo Park, Daejeon (KR); Dae Hee Lee, Daejeon (KR); Yoon Kyung Kwon, Daejeon (KR); Hyun Seong Ko, Seoul (KR)

(73) Assignee: LG CHEM, LTD., Seoul (KR)

( * ) Notice: Subject to any disclaimer, the term of this patent is extended or adjusted under 35 U.S.C. 154(b) by 314 days.

(21) Appl. No.: 13/371,069

(22) Filed: Feb. 10, 2012

(65) Prior Publication Data
US 2012/0204952 A1 Aug. 16, 2012

(30) Foreign Application Priority Data

Feb. 10, 2011 (KR) .................. 10-2011-0011814
Feb. 9, 2012 (KR) .................. 10-2012-0013432

(51) Int. Cl.
*H01L 31/0232* (2014.01)
*H01L 31/048* (2014.01)
*H01L 31/055* (2014.01)

(52) U.S. Cl.
CPC ............ *H01L 31/048* (2013.01); *H01L 31/055* (2013.01); *Y02E 10/52* (2013.01)

(58) Field of Classification Search
CPC ..... H01L 31/18; H01L 31/048; H01L 31/055; H01L 31/0232; Y02E 10/52
USPC ............................ 136/252, 256, 257; 427/157
See application file for complete search history.

(56) References Cited

U.S. PATENT DOCUMENTS

| | | | |
|---|---|---|---|
| 6,372,870 B1 * | 4/2002 | Kitahara et al. | 526/250 |
| 2003/0193709 A1 * | 10/2003 | Mallya et al. | 359/245 |
| 2004/0119933 A1 * | 6/2004 | Harada et al. | 349/175 |
| 2005/0162606 A1 * | 7/2005 | Doane et al. | 349/158 |
| 2005/0195354 A1 * | 9/2005 | Doane et al. | 349/143 |

(Continued)

FOREIGN PATENT DOCUMENTS

| | | | | |
|---|---|---|---|---|
| GB | 2307055 A | * | 5/1997 | |
| JP | 60148173 | * | 8/1985 | ........... H01L 31/04 |

(Continued)

OTHER PUBLICATIONS

KR20090069894A Won et al., English Equivalent.*

(Continued)

*Primary Examiner* — Susan D Leong
(74) *Attorney, Agent, or Firm* — Dentons US LLP

(57) ABSTRACT

A front sheet of solar cell, a method of manufacturing the same and a photovoltaic module are provided. The front sheet of solar cell can effectively block infrared rays (IRs) by forming an IR blocking layer including a cholesteric liquid crystal (CLC) material on a substrate. Thus, an increase in temperature of a cell can be suppressed so that the power generation efficiency of the cell can be improved. Also, the multi-layered sheet can be configured so that a UV blocking layer including a fluorine-based polymer and a wavelength conversion material can be formed on the IR blocking layer. Thus, wavelengths of a UV region can be converted into wavelengths of a VR region so that the power generation efficiency of the cell can be improved, and discoloration and deformation caused by UVs can be prevented so that the weather resistance can be improved.

17 Claims, 6 Drawing Sheets

(56) References Cited

U.S. PATENT DOCUMENTS

| | | | |
|---|---|---|---|
| 2007/0152188 A1* | 7/2007 | Silverman et al. | 252/299.01 |
| 2009/0155544 A1* | 6/2009 | Nakamura et al. | 428/189 |
| 2010/0079721 A1* | 4/2010 | Qi et al. | 349/195 |

FOREIGN PATENT DOCUMENTS

| | | | |
|---|---|---|---|
| JP | 2003218379 A * | 7/2003 | |
| JP | 2008280202 A * | 11/2008 | |
| JP | 2009-522399 | 6/2009 | |
| KR | 20090069894 A * | 7/2009 | |
| KR | 10-2010-0009235 | 1/2010 | |
| WO | 2007-075189 | 7/2007 | |

OTHER PUBLICATIONS

JP2003218379A Nakao et al., English equivalent of the Abstract.*
JP2008280202A, Tadami et al. English equivalent of the abstract.*
JP60148173 Fujita 1985, english equivalent of the abstract.*

* cited by examiner

FRONT SHEET OF SOLAR CELL, METHOD OF MANUFACTURING THE SAME AND PHOTOVOLTAIC MODULE COMPRISING THE SAME

CROSS-REFERENCE TO RELATED APPLICATION

This application claims priority to and the benefit of Korean Patent Application Nos. 10-2011-0011814, filed Feb. 10, 2011 and 10-2012-0013432, filed Feb. 9, 2012, the disclosures of which are incorporated herein by reference in their entirety.

BACKGROUND

1. Field of the Invention

The present invention relates to a front sheet for solar cells, a method of manufacturing the same and a photovoltaic module including the same.

2. Discussion of Related Art

Recently, much attention has been paid to renewable and clean energy because of global environmental problems and exhaustion of fossil fuels. Among these, solar energy has attracted attention as a representative pollution-free energy source which can solve the problems of environmental contamination and exhaustion of fossil fuels.

A solar cell to which a principle of photovoltaic power generation is applied is a device configured to convert sunlight into electric energy. In general, the solar cell is manufactured from a monocrystalline, polycrystalline or amorphous silicon-based semiconductor, and has a basic structure similar to a diode.

Since the solar cell is exposed for a long time to external environments to facilitate absorption of sunlight, it is manufactured into a unit by performing several packaging processes to protect the cells. Such a unit is referred to as a photovoltaic module.

Generally, a photovoltaic cell should absorb as great a quantity of solar radiation energy as possible to enhance the efficiency the photovoltaic cell, but a large quantity of the solar radiation energy may be a major cause for increasing the temperature of a cell. The performance of the solar cell is degraded as an operating temperature increases. Thus, an increase in operating temperature of the solar cell should be suppressed to improve the efficiency of the photovoltaic module.

Although it is desirable for a photovoltaic module to receive a larger quantity of sunlight so as to generate a larger quantity of power, an infrared ray (IR) region of sunlight is hardly used to generate solar power, and may be a major cause for increasing the temperature of a cell, which leads to deteriorated efficiency of the solar cell. In general, a crystalline module and a thin film module have temperature coefficients of $-0.5\%/°C$ and $-0.25\%/°C$, respectively. Here, the temperature coefficient represents that the power generation efficiency is degraded as the temperature of a cell increases. Therefore, when the IR region of sunlight which is not required for generation of solar power is selectively blocked, an increase in temperature of the photovoltaic cell may be suppressed so that the power generation efficiency can be enhanced.

In this regard, there has been research conducted in the prior art to suppress an increase in temperature of a photovoltaic cell by depositing a transparent inorganic oxide on a side of the photovoltaic cell to which sunlight is incident so as to transmit visible rays (VRs) but block an IR region of sunlight. However, the technique has a problem in that the cost for a multi-layered vapor deposition process is very high.

Korean Patent Publication No. 2008-0029230 discloses a conventional technique using an IR blocking layer. However, the technique has a problem in that heat may be generated since IRs are blocked by absorption, or the transmittance may be deteriorated within a VR region due to poor selectivity at a certain wavelength range.

Therefore, there is continuous demand for a material for photovoltaic modules which is able to maintain transmittance at a VR region, effectively suppress an increase in temperature of a cell by effectively blocking an IR region having a certain wavelength range, and improve the power generation efficiency of cells.

SUMMARY OF THE INVENTION

The present invention is directed to providing a front sheet for solar cells, a method of manufacturing the same and a photovoltaic module including the same.

One aspect of the present invention provides a multi-layered sheet including a substrate, an IR blocking layer and an ultraviolet ray (UV) blocking layer, which are sequentially formed. Such a multi-layered sheet may be used as a front sheet for solar cell, the substrate is disposed at cells of a solar cell and the UV blocking layer is disposed at a side to which light is incident.

As one example, the multi-layered sheet may include a substrate, an IR blocking layer formed on one surface of the substrate and including a cholesteric liquid crystal (CLC) material, and a UV blocking layer formed on the IR blocking layer and including a fluorine-based polymer and a wavelength conversion material.

Another aspect of the present invention provides a method of manufacturing a multi-layered sheet. Here, the manufacturing method may include forming an IR blocking layer by coating one surface of a substrate with a composition for forming an IR blocking layer including a CLC material, and forming a UV blocking layer by coating the IR blocking layer with a composition for forming a UV blocking layer including a fluorine-based polymer and a wavelength conversion material.

Still another aspect of the present invention provides a photovoltaic module including a front sheet of solar cell according to illustrative embodiments of the present invention.

BRIEF DESCRIPTION OF THE DRAWINGS

The above and other objects, features and advantages of the present invention will become more apparent to those of ordinary skill in the art by describing in detail illustrative embodiments thereof with reference to the attached drawings, in which.

DETAILED DESCRIPTION

Hereinafter, illustrative embodiments of the present invention will be described in detail. However, the present invention is not limited to the embodiments disclosed below, but can be implemented in various forms. The following embodiments are described in order to enable those of ordinary skill in the art to embody and practice the present invention.

Although the terms first, second, etc. may be used to describe various elements, these elements are not limited by these terms. These terms are only used to distinguish one element from another. For example, a first element could be termed a second element, and, similarly, a second element could be termed a first element, without departing from the scope of illustrative embodiments. The term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of illustrative embodiments. The singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, components and/or groups thereof, but do not preclude the presence or addition of one or more other features, integers, steps, operations, elements, components and/or groups thereof.

With reference to the appended drawings, illustrative embodiments of the present invention will be described in detail below. To aid in understanding the present invention, like numbers refer to like elements throughout the description of the figures, and the description of the same elements will be not reiterated.

One illustrative embodiment of the present invention is directed to providing a multi-layered sheet including a substrate, an IR blocking layer formed on one surface of the substrate and including a cholesteric liquid crystal (CLC) material, and a UV blocking layer formed on the IR blocking layer and including a fluorine-based polymer and a wavelength conversion material. The multi-layered sheet may be used as a front sheet which is used in a side of a solar cell to which light is incident.

Figure 1:
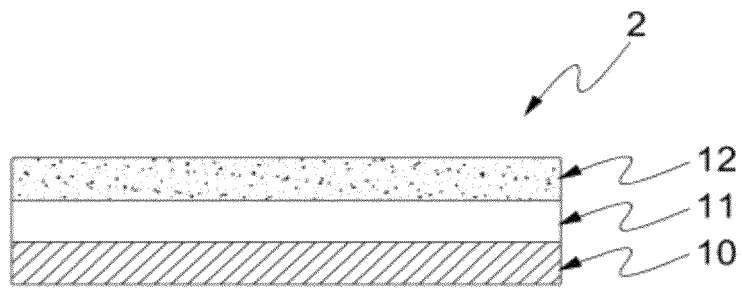
FIGS. 1 and 2 are cross-sectional views showing a multi-layered sheet according to one illustrative embodiment of the present invention.

FIG. 1 is a cross-sectional view showing a multi-layered sheet according to one illustrative embodiment of the present invention. As shown in FIG. 1, the multi-layered sheet 2 according to the present invention may include a substrate 10, an IR blocking layer 11 formed on one surface of the substrate 10 and including a CLC material, and a UV blocking layer 12 formed on the IR blocking layer 11 and including a fluorine-based polymer and a wavelength conversion material.

According to the present invention, specific kinds of the substrate included in the multi-layered sheet are not particularly limited. Various materials known in the art may be used herein, but a transparent film having excellent weather resistance and mechanical property may be desirably used.

According to the present invention, for example, a polyethylene terephthalate (PET) film, poly(meth)acryl film, polyvinylidene chloride (PVDC) film or polyvinyl chloride (PVC) film, which is transparent and shows excellent weather resistance and mechanical property, may be used as the substrate, but the present invention is not limited thereto.

According to the present invention, a thickness of the substrate is not particularly limited, but may be, for example, in a range of 10 μm to 1000 or 50 μm to 500 μm. The thickness of the substrate may be controlled to this thickness range so that an electric insulation property, a moisture barrier property, a mechanical property and a handling property of the multi-layered sheet can be excellently maintained. According to the present invention, however, the thickness of the substrate is not limited to the above-described thickness range, and may be properly adjusted, when necessary.

The multi-layered sheet according to the present invention includes an IR blocking layer formed on one surface of the substrate and including a CLC material. Since the IR blocking layer includes the CLC material, the multi-layered sheet may serve to effectively block IRs by reflecting wavelengths of an IR region of incident light. Thus, an increase in temperature of a cell may be suppressed so that the power generation efficiency of the cell can be improved.

According to the present invention, the CLC material included in the IR blocking layer is a liquid crystal in which each layer of molecules arranged on a plane rotates in a spiral fashion. Here, since the spiral periodicity is sensitive to the temperature, voltage, external force and contact with a chemical material, the CLC material has optical properties such as optical rotary power, selective light scattering, circular dichroism, etc. According to illustrative embodiments of the present invention, the CLC material may include a nematic liquid crystal compound and a chiral compound.

In the nematic liquid crystal compound, molecules in a long bar shape are arranged in parallel to each other, and there is no regularity at a central position of the molecules but order in a molecular axis direction. The molecules of the nematic liquid crystal compound may move freely in a major axis direction so that the fluidity can be good due to low viscosity. Also, since polarization is offset due to substantially the same size of the molecules in a vertical direction, the molecules do not generally show ferroelectricity. The molecular arrangement of the nematic liquid crystal compound may be varied according to the temperature, magnetic field or electric field.

According to the present invention, kinds of the nematic liquid crystal compound are not particularly limited. However, nematic liquid crystal compounds may be used without limitation as long as they contain a mesogen group. Here, the nematic liquid crystal compound may be a curable compound.

Generally, the liquid crystal compound has a long and solid middle portion and a terminal portion composed of a long chain. Here, the solid middle portion is referred to as a mesogen structure, and a chain structure region in the terminal portion of the molecule is referred to as a flexible lattice. In general, the mesogen group has several ring structures such as a cycloalkane or aromatic ring, and the ring structures are linked to each other by ester linkage or carbonyl linkage. The flexible lattice is formed by binding of various functional group chains with various lengths, such as an alkyl group, an alkoxy group or a vinyl group. The flexible lattice may bind to both ends of the molecule or only one end of the molecule.

According to another illustrative embodiment of the present invention, the CLC material may include a cross-linkable or polymerizable liquid crystal compound and a chiral compound. That is, the IR blocking layer may be formed by coating a substrate with a composition including the cross-linkable or polymerizable liquid crystal compound and the chiral compound and cross-linking or polymerizing the composition while the spiral periodicity is being induced by the chiral compound. In this case, the IR blocking layer may include a cross-linked or polymerized liquid crystal polymer. In this case, the chiral compound may be cross-linkable or polymerizable, or non-cross-linkable or non-polymerizable.

As one example, the CLC compound of the IR blocking layer may include a compound represented by the following Formula 1 in a cross-linked or polymerized form.

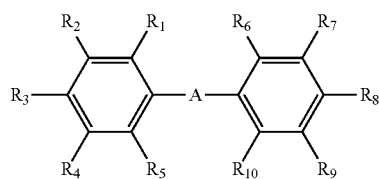

Formula 1

In Formula 1, A is a single bond, —COO— or —OCO—, and $R_1$ to $R_{10}$ each independently represent hydrogen, a halogen, an alkyl group, an alkoxy group, a cyano group, a nitro group, —O-Q-P or a substituent represented by the following Formula 2, provided that at least one of $R_1$ to $R_{10}$ is —O-Q-P or a substituent of the following Formula 2. As such, Q is an alkylene group or an alkylidene group, and P is an alkenyl group, an epoxy group, a cyano group, a carboxyl group, an acryloyl group, a (meth)acryloyl group, an acryloyloxy group or a (meth)acryloyloxy group.

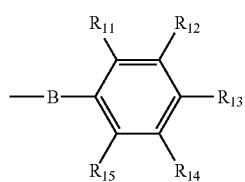

Formula 2

In Formula 2, B is a single bond, —COO— or —OCO—, and $R_{11}$ to $R_{15}$ each independently represent hydrogen, a halogen, an alkyl group, an alkoxy group, a cyano group, a nitro group or —O-Q-P, provided that at least one of $R_{11}$ to $R_{15}$ is —O-Q-P. As such, Q is an alkylene group or an alkylidene group, and P is an alkenyl group, an epoxy group, a cyano group, a carboxyl group, an acryloyl group, a (meth)acryloyl group, an acryloyloxy group or a (meth)acryloyloxy group.

In Formula 2, the symbol "-" on the left side of B means that B is directly linked to benzene in Formula 1.

In Formulas 1 and 2, the term "single bond" means that there is no additional atom at a site represented by A or B. For example, when A in Formula 1 is a single bond, benzenes present at both sides of A may be directly joined together to form a biphenyl structure.

In Formulas 1 and 2, the halogen that may be used herein may include chlorine, bromine or iodine.

In Formulas 1 and 2, the alkyl group that may be used herein may include a linear or branched alkyl group having 1 to 20 carbon atoms, 1 to 16 carbon atoms, 1 to 12 carbon atoms, 1 to 8 carbon atoms or 1 to 4 carbon atoms, or a cycloalkyl group having 3 to 20 carbon atoms, 3 to 16 carbon atoms or 4 to 12 carbon atoms. Also, the alkyl group may be optionally substituted with at least one substituent.

In Formulas 1 and 2, the alkoxy group that may be used herein may include an alkoxy group having 1 to 20 carbon atoms, 1 to 16 carbon atoms, 1 to 12 carbon atoms, 1 to 8 carbon atoms or 1 to 4 carbon atoms. The alkoxy group may be linear, branched or cyclic. Also, the alkoxy group may be optionally substituted with at least one substituent.

Also, in Formulas 1 and 2, the alkylene group or alkylidene group that may be used herein may include an alkylene group or alkylidene group having 1 to 12 carbon atoms, 4 to 10 carbon atoms or 6 to 9 carbon atoms. The alkylene group or alkylidene group may be linear, branched or cyclic. Also, the alkylene group or alkylidene group may be optionally substituted with at least one substituent.

In addition, in Formulas 1 and 2, the alkenyl group that may be used herein may include an alkenyl group having 2 to 20 carbon atoms, 2 to 16 carbon atoms, 2 to 12 carbon atoms, 2 to 8 carbon atoms or 2 to 4 carbon atoms. The alkenyl group may be linear, branched or cyclic. Also, the alkenyl group may be optionally substituted with at least one substituent.

As such, the substituent that may be substituted for the alkyl group, alkoxy group, alkenyl group, alkylene group or alkylidene group may include an alkyl group, an alkoxy group, an alkenyl group, an epoxy group, a cyano group, a carboxyl group, an acryloyl group, a (meth)acryloyl group, an acryloyloxy group, a (meth)acryloyloxy group or an aryl group, but the present invention is not limited thereto.

According to certain illustrative embodiments, P in Formulas 1 and 2 may be an acryloyl group, a (meth)acryloyl group, an acryloyloxy group or a (meth)acryloyloxy group. Also, P may be an acryloyloxy group or (meth)acryloyloxy group, and the acryloyloxy group may be preferred.

In Formulas 1 and 2, —O-Q-P or a residue of Formula 2 that may be present in plural numbers may be, for example, present in a position of $R_3$, $R_8$ or $R_{13}$, and one or two substituents may be, for example, preferred. In the compound of Formula 1 or the residue of Formula 2, a substituent other than —O-Q-P or the residue of Formula 2 may be, for example, hydrogen, a halogen, a linear or branched alkyl group having 1 to 4 carbon atoms, a cycloalkyl group having 4 to 12 carbon atoms, a cyano group, an alkoxy group having 1 to 4 carbon atoms, a cyano group or a nitro group. Also, the substituent may be chlorine, a linear or branched alkyl group having 1 to 4 carbon atoms, a cycloalkyl group having 4 to 12 carbon atoms, an alkoxy group having 1 to 4 carbon atoms or a cyano group.

The chiral compound included in the CLC compound of the IR blocking layer has a symmetric steric structure, similar to a right and left hand relationship. Therefore, the chiral compound has the same chemical structure or physical property, and has a different steric structure due to the enantiomeric relationship. When a certain content of the chiral compound is present in the nematic liquid crystal compound and the compound represented by Formula 1, the spiral periodicity may be induced.

According to the present invention, kinds of the chiral compound may be used without limitation as long as they may serve to induce desired spiral periodicity without causing damage to the liquid crystallinity, for example, nematic regularity, of the liquid crystal compound.

The chiral compound used to induce the spiral periodicity in liquid crystals may include at least chirality in the molecular structure. For example, the chiral compound that may be used herein may include a compound having one or two or more asymmetric carbons, a compound having an asymmetric point on heteroatoms, such as chiral amine or chiral sulfoxide, or a compound having an axially asymmetric, optically active site, such as cumulene or binaphthol. For example, the chiral compound may be a low molecular compound having a molecular weight of 1,500 or less. For example, a commercially available chiral nematic liquid crystal, for example, chiral dopant liquid crystal S-811 (commercially available from Merck) or Paliocolor LC 756 (commercially available from BASF) may be used as the chiral compound, but the present invention is not limited thereto.

The term "parts by weight" used herein refers to a relative weight ratio between materials.

According to the present invention, the CLC material may include the nematic liquid crystal compound and the chiral compound at a content of 75 parts by weight to 99 parts by weight and 1 part by weight to 25 parts by weight, respectively, so that the CLC material can selectively reflect light having a selective reflection center wavelength of 700 nm to 2,650 nm, 1,000 nm to 2,650 nm, greater than 1,000 nm and 2,650 nm or less, 1,000 nm to 1,400 nm, 1,400 nm to 1,800 nm, or 2,000 nm to 2,650 nm. Here, the CLC material has a reflection center wavelength closer to IRs having a short wavelength, that is, VRs, as a content of the chiral compound increases. On the other hand, the CLC material has a reflection center wavelength closer to IRs having a long wavelength as a content of the chiral compound decreases. Also, the more the center of reflection wavelengths is increased, the higher the reflection wavelength width is.

More particularly, when Paliocolor LC 242 (commercially available from BASF) is used as the nematic liquid crystal compound and Paliocolor LC 756 (commercially available from BASF) is used as the chiral compound, the compounds may be included at contents of 96.5 parts by weight to 99 parts by weight and 1 part by weight to 3.5 parts by weight, respectively, so that they can selectively reflect light having a wavelength of 1,000 nm to 2,650 nm.

As another example, when Licrivue RMS09-085 (commercially available from Merck) is used as the nematic liquid crystal compound and Licrivue RMS09-084 (commercially available from Merck) is used as the chiral compound, the compounds may be included at contents of 75 parts by weight to 95 parts by weight and 5 parts by weight to 25 parts by weight, respectively, so that they can selectively reflect light having a wavelength of 1,000 nm to 2,650 nm. In this case, in order to form the IR blocking layer, a substrate is primarily coated with a composition, and a coating layer is primarily irradiated with weak UVs to form a concentration gradient in the coating layer of the chiral compound. Then, when a secondary curing process is completed, it is possible to form an IR blocking layer having a larger wavelength width, compared to conventional IR blocking layers.

As such, the CLC material according to the present invention may suppress an increase in temperature of a cell by reflecting light having wavelengths of an IR region, thereby improving the power generation efficiency of the cell.

According to the present invention, a direction of rotation of the CLC material may be changed according to the direction of rotation of the chiral compound. That is, when a levorotatory chiral compound binds to the nematic liquid crystal compound, a levorotatory CLC material may be formed, whereas a dextrorotatory CLC material may be formed when a dextrorotatory chiral compound binds to the nematic liquid crystal compound.

A thickness of the IR blocking layer may be in a range of 1 μm to 50 μm, or 5 μm to 20 μm. The thickness of the IR blocking layer may be controlled to this thickness range so that a sufficient IR blocking effect can be provided, and problems such as haze caused by formation of spots caused by poor liquid crystal orientation, and the manufacturing costs can be reduced.

The IR blocking layer according to the present invention may block light of a certain wavelength region by controlling the kind, content and thickness of the CLC material.

The IR blocking layer according to the present invention may have a single-layer structure or a multi-layered structure of two or more layers. When the IR blocking layer according to the present invention has a multi-layered structure of two or more layers, different CLC materials may be included in each layer constituting the IR blocking layer. For example, a CLC material prepared with different contents of the nematic liquid crystal compound and the chiral compound are used in each layer constituting the IR blocking layer, light with different wavelength regions may be reflected on each layer. Thus, in the present invention, when the IR blocking layer is manufactured with a multi-layered structure of two or more layers and different kinds of the CLC material used are included in each IR blocking layer, for example, when the nematic liquid crystal compound and the chiral compound are included at different contents, IRs with a certain wavelength region may be blocked from each IR blocking layer, thereby effectively blocking IRs of a wide wavelength region.

The IR blocking layer according to the present invention may further include a UV stabilizer or a heat stabilizer, so that the weather resistance can be improved by preventing discoloration and deformation caused by UVs or heat.

Kinds of the UV stabilizer are not particularly limited, and may include, for example, at least one selected from the group consisting of a metal deactivator, a UV absorbent, a quencher, a peroxide decomposing agent, a radical scavenger and a hindered amine light stabilizer (HALS). Specific kinds of the metal deactivator, the UV absorbent, the quencher, the peroxide decomposing agent, the radical scavenger and the HALS are not particularly limited, but those compounds widely known in the art may be used without limitation.

Kinds of the heat stabilizer are not particularly limited, but heat stabilizers widely known in the art may be used without limitation.

The IR blocking layer according to the present invention may include the heat stabilizer or UV stabilizer at a content of 0.001 parts by weight to 10 parts by weight, based on 100 parts by weight of the CLC material. When the content of the heat stabilizer or UV stabilizer is less than 0.001 parts by weight, the effects by addition of the heat stabilizer or UV stabilizer may not be sufficient. On the other hand, when the content of the heat stabilizer or UV stabilizer exceeds 10 parts by weight, orientation of liquid crystal materials may be hindered.

The multi-layered sheet according to illustrative embodiments of the present invention may further include a UV blocking layer formed on the IR blocking layer. In this case, wavelengths of a UV region may be converted into wavelengths of a VR region so that the power generation efficiency of a cell using the multi-layered sheet according to illustrative embodiments of the present invention can be improved. Also, discoloration caused by UVs may be prevented so that the weather resistance of the multi-layered sheet can be improved. Such a UV blocking layer may include a fluorine-based polymer and a wavelength conversion material.

The fluorine-based polymer included as a base material of the UV blocking layer may serve to give an anti-fouling property by lowering a surface energy of the UV blocking layer. In particular, the fluorine-based polymer may maximize absorption of UVs by a wavelength conversion material since the fluorine-based polymer does not absorb but transmits most of the UVs, compared to ethylenevinylacetate (EVA) or acrylate used as a base material in the art to allow an external structural body to block UVs. In addition, the fluorine-based polymer has excellent properties such as weather resistance, and thus degradation of the surface properties by UVs may be prevented even when exposed to the outdoor environments for a long time, and the optical transmittance may be maintained without yellowing.

Kinds of the fluorine-based polymer are not particularly limited. For example, the fluorine-based polymer may be a homopolymer, a copolymer or a mixture thereof including at least one monomer selected from the group consisting of vinylidene fluoride (VDF), vinyl fluoride (VF), tetrafluoroethylene (TFE) hexafluoropropylene (HFP), chlorotrifluoroethylene (CTFE), trifluoroethylene, hexafluoroisobutylene, perfluorobutyl ethylene, perfluoro(methylvinylether) (PMVE), perfluoro(ethylvinylether) (PEVE), perfluoro(propylvinylether) (PPVE), perfluoro(hexylvinylether) (PHVE), perfluoro-2,2-dimethyl-1,3-dioxol (PDD) and perfluoro-2-methylene-4-methyl-1,3-dioxolane (PMD) in a polymerized form.

Also, the fluorine-based polymer may be a copolymer including VDF and a comonomer or a copolymer including VF and a comonomer. Kinds of the comonomer which may be included in a copolymerized form in the fluorine-based copolymer are not particularly limited, but may include at least one selected from the group consisting of, for example, TFE, HFP, CTFE, trifluoroethylene, hexafluoroisobutylene, perfluorobutyl ethylene, PMVE, PEVE, PPVE, PHVE, PDD and PMD, but the present invention is not limited thereto. As one example, the HFP or CTFE may be preferred.

According to the present invention, a content of the comonomer included in the fluorine-based copolymer is not particularly limited, but may be, for example, in a range of 0.5% by weight to 50% by weight, 1% by weight to 40% by weight, 7% by weight to 40% by weight, 10% by weight to 30% by weight, or 10% by weight to 20% by weight, based on the total weight of the fluorine-based copolymer. According to the present invention, when the content of the comonomer included in the fluorine-based copolymer is controlled to this content range, the durability and weather resistance of the multi-layered sheet may be secured and low-temperature drying may be induced.

According to the present invention, the fluorine-based polymer may have a weight average molecular weight of 50,000 to 1,000,000, 100,000 to 700,000, or 300,000 to 500,000, but the present invention is not limited thereto. According to the present invention, the weight average molecular weight is a value converted from that of a polystyrene standard as measured using gel permeation chromatography (GPC). According to the present invention, when the weight average molecular weight of the fluorine-based polymer is controlled to this range, excellent solubility and other physical properties may be secured.

According to the present invention, the fluorine-based polymer may also have a melting point of 80° C. to 175° C., for example, 120° C. to 165° C. According to the present invention, when the melting point of the fluorine-based polymer is controlled to 80° C. or higher, deformation of the multi-layered film may be prevented upon the use of the multi-layered film. When the melting point of the fluorine-based polymer is controlled to 175° C. or lower, it is possible to adjust the solubility in a solvent and improve the gloss of a coated surface.

The wavelength conversion material included in the UV blocking layer together with the fluorine-based polymer may be a fluorescent material that absorbs light having a short wavelength region and emits light having a long wavelength region, particularly, a VR region.

In general, the photovoltaic cell may absorb light having a wavelength region of approximately 400 nm to approximately 1100 nm to generate electricity. For example, a silicon photovoltaic cell has poor efficiency at a short wavelength region since the silicon photovoltaic cell absorbs light of a VR region having a wavelength band of approximately 600 nm to approximately 800 nm but does not absorb light of a short wavelength region including a UV region.

According to the present invention, however, the fluorescent material may serve to absorb light having a wavelength around 400 nm, particularly, a wavelength of 300 nm to 400 nm, convert the wavelength of light and emit light having a wavelength of 400 nm or more, particularly, a wavelength of 400 nm to 1,000 nm, so that the light of a VR region can be amplified, and thus the power generation efficiency of a cell can be improved.

Also, since light with long wavelengths to be absorbed by the UV blocking layer should not be blocked by the UV blocking layer, the fluorescent material may have a transmittance of 85% or more with respect to light having a wavelength of 400 nm or more, particularly, light of a VR region.

Meanwhile, according to the present invention, the fluorescent material may be an organic fluorescent material, an inorganic fluorescent material or an organic phosphorescent material. According to the present invention, however, an inorganic fluorescent material may be used as the fluorescent material since the organic fluorescent material is not suitable for long-term use due to poor durability. For example, the fluorescent material may be an inorganic fluorescent material including a rare earth element as impurities (a dopant). Here, the rare earth element has a characteristic of absorbing light of a UV region and emitting light of a long wavelength region.

Specific kinds of the inorganic fluorescent material that may be used herein may include at least one selected from the group consisting of $La_2O_2S:Eu$, $(Ba,Sr)_2SiO_4:Eu$ and $Sr_5(PO_4)_3Cl:Eu$, but the present invention is not limited thereto.

According to the present invention, a primary average particle size of the fluorescent material is not particularly limited, but may be in a range of 1 nm to 100 nm, more particularly, 5 nm to 50 nm, or 10 nm to 30 nm. When the primary average particle size of the fluorescent material is less than 1 nm, it is difficult to prepare and disperse a fluorescent material, whereas the transparency of the UV blocking layer may be degraded when the primary average particle size of the fluorescent material exceeds 100 nm. Here, the term "primary average particle size" refers to a size of particles when the particles are homogeneously dispersed.

The average particle size of the fluorescent material may be controlled to 100 nm or less so that the fluorescent material can prevent optical loss by absorbing or refracting incident light on the UV blocking layer. As a result, an optical gain obtained when the fluorescent material absorbs UVs and emits VRs may be further enhanced in contrast to the optical loss of UVs by reflection or refraction of light.

The UV blocking layer according to the present invention may include the wavelength conversion material at a content of 0.1 parts by weight to 10 parts by weight, based on 100 parts by weight of the fluorine-based polymer. The content of the wavelength conversion material may be controlled to this content range so that a UV blocking effect and the transparency of the UV blocking layer may be secured.

The UV blocking layer according to the present invention may further include at least one of fine particles selected from the group consisting of zinc oxide, titanium oxide, cerium oxide, zirconium oxide and iron oxide. According to the present invention, the fine particles included in the UV blocking layer may serve to block UVs.

According to the present invention, a primary average particle size of the fine particles is not particularly limited, but may be in a range of 1 nm to 100 nm, and, more particularly, 5 nm to 50 nm, or 10 nm to 30 nm. When the primary average particle size of the fine particles is less than 1 nm, it is difficult to prepare and disperse the fine particles, whereas the transparency of the UV blocking layer may be degraded when the primary average particle size of the fine particles exceeds 100 nm.

According to the present invention, the fine particles may be subjected to surface treatment using at least one compound selected from the group consisting of an aluminum coupling agent, a titanium coupling agent and a silane coupling agent. The fine particles may be subjected to surface treatment so that the dispersibility of the fine particles can be improved.

According to the present invention, specific kinds of the aluminum coupling agent, titanium coupling agent and silane coupling agent are not particularly limited, but coupling agents generally known in the art may be selected and used without limitation.

The UV blocking layer according to the present invention may include the fine particles at a content of 0.1 parts by weight to 10 parts by weight, based on 100 parts by weight of the fluorine-based polymer. The content of the fine particles may be controlled to this content range so that a UV blocking effect and the transparency of the UV blocking layer may be secured.

The UV blocking layer according to the present invention may further include a HALS or UV absorbent to prevent UVs from penetrating the UV blocking layer and being incident to the photovoltaic module, thereby improving the weather resistance of the photovoltaic module.

According to the present invention, kinds of the UV absorbent are not particularly limited. Here, the UV absorbent may be a triazine-based UV absorbent or a benzotriazole-based UV absorbent. Kinds of the triazine-based UV absorbent and the benzotriazole-based UV absorbent are not particularly limited, but UV absorbents widely known in the art may be used without limitation.

The UV blocking layer according to the present invention may include the HALS or UV absorbent at a content of 0.01 parts by weight to 10 parts by weight, based on 100 parts by weight of the fluorine-based polymer. The content of the HALS or UV absorbent may be controlled to this content range so that a UV blocking effect and the transparency of the UV blocking layer may be secured, and the physical properties of the fluorine-based polymer may be maintained.

The UV blocking layer may be a coating layer formed using a coating process. This coating process may be desirable in an aspect of the manufacturing costs compared to a conventional stacking method such as lamination after preparation of a film, and thus it has an advantage in that the processing temperature may be reduced.

According to the present invention, the UV blocking layer may have a thickness of 1 μm to 100 μm, or 5 μm to 20 μm. The thickness of the UV blocking layer may be controlled to this thickness range so that a UV blocking effect and the easy processability may be secured.

The multi-layered sheet according to the present invention may further include a pressure-sensitive adhesive layer formed on the other surface of the substrate to which the IR blocking layer is not attached.

Figure 2:
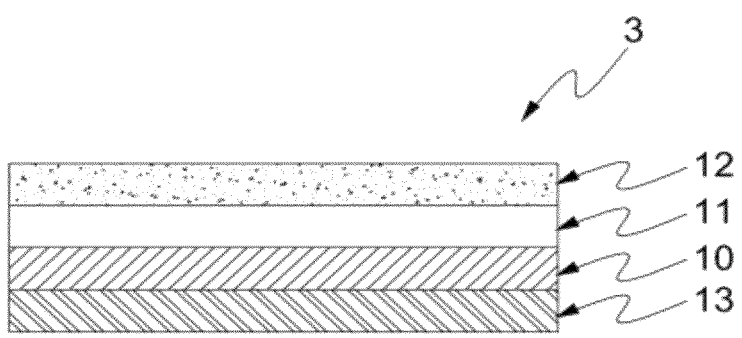

FIG. 2 is a cross-sectional view showing a multi-layered sheet according to another illustrative embodiment of the present invention. As shown in FIG. 2, the multi-layered sheet 3 according to the present invention may include a substrate 10, an IR blocking layer 11 formed on one surface of the substrate 10 and including a CLC material, a UV blocking layer 12 formed on the IR blocking layer 11 and including a fluorine-based polymer and a wavelength conversion material, and a pressure-sensitive adhesive layer 13 formed on the other surface of the substrate 10.

The multi-layered sheet according to the present invention serves as a passivation film for protecting a glass plate that is a front substrate to which light is incident when used as the front sheet for solar cells, and is stacked on the front substrate such as a glass plate. The pressure-sensitive adhesive layer 13 of the multi-layered sheet is used to improve an adhesive strength to a glass plate, and may include a pressure-sensitive adhesive resin that is transparent and has excellent weather resistance. Kinds of the pressure-sensitive adhesive resin are not particularly limited, but a silicon-based resin, a fluorine-based resin, an EVA-based resin or an acrylic resin which has excellent weather resistance may be used as the pressure-sensitive adhesive resin.

Also, the pressure-sensitive adhesive layer according to the present invention may include transparent inorganic particles to maximize the optical transmittance of light which is incident to a glass plate arranged in a lower portion of the front sheet. The transparent inorganic particles may serve to improve a refractive index of the pressure-sensitive adhesive layer. Thus, a quantity of light transmitted from the front sheet to the glass plate may be increased by controlling the refractive index of the pressure-sensitive adhesive layer to a refractive index similar to that of the glass plate. Kinds of the transparent inorganic particles are not particularly limited, but the transparent inorganic particles may be at least one of fine particles selected from the group consisting of zinc oxide, titanium oxide, cerium oxide, zirconium oxide and iron oxide.

According to the present invention, a primary average particle size of the fine particles is not particularly limited, but may be in a range of 1 nm to 100 nm, 5 nm to 50 nm, or 10 nm to 30 nm. When the primary average particle size of the fine particles is less than 1 nm, it is difficult to prepare and disperse the fine particles, whereas the transparency of the pressure-sensitive adhesive layer may be degraded when the primary average particle size of the fine particles exceeds 100 nm.

The pressure-sensitive adhesive layer according to the present invention may include the transparent inorganic particles at a content of 1 part by weight to 30 parts by weight, based on 100 parts by weight of the pressure-sensitive adhesive resin. The content of the transparent inorganic particles may be controlled to this content range so that the optical transmittance of the pressure-sensitive adhesive layer can be improved, and the pressure-sensitive adhesivity may also be secured.

According to the present invention, in order to improve the efficiency of the photovoltaic cell, a refractive index of the pressure-sensitive adhesive layer may be adjusted to a refractive index similar to that of the glass plate by increasing the light incident to the glass plate of the front sheet to the maximum.

The pressure-sensitive adhesive layer according to the present invention may further include a UV stabilizer or heat stabilizer so that the weather resistance can be enhanced by preventing discoloration and deformation caused by UVs or heat.

According to the present invention, kinds of the UV stabilizer are not particularly limited, and may include, for example, at least one selected from the group consisting of a metal deactivator, a UV absorbent, a quencher, a peroxide decomposing agent, a radical scavenger and a HALS. Specific kinds of the metal deactivator, the UV absorbent, the quencher, the peroxide decomposing agent, the radical scavenger and the HALS are not particularly limited, but those compounds widely known in the art may be used without limitation.

According to the present invention, kinds of the heat stabilizer are not particularly limited, but heat stabilizers widely known in the art may be used without limitation.

The pressure-sensitive adhesive layer according to the present invention may include the heat stabilizer or UV stabilizer at a content of 0.1 parts by weight to 10 parts by weight, based on 100 parts by weight of the pressure-sensitive adhesive resin. The content of the heat stabilizer or UV stabilizer may be controlled to this content range so that the weather resistance and pressure-sensitive adhesivity can be secured.

According to the present invention, the pressure-sensitive adhesive layer may have a thickness of 1 µm to 100 µm, or 5 µm to 50 µm. When the thickness of the pressure-sensitive adhesive layer is less than 1 µm, it is difficult to secure the sufficient adhesive strength. On the other hand, when the thickness of the pressure-sensitive adhesive layer exceeds 100 µm, it is difficult to form a film using a coating process, and the manufacturing costs may be increased.

Also, the present invention is directed to providing a method of manufacturing a multi-layered sheet, that is, a front sheet for solar cells. According to one illustrative embodiment of the present invention, the method of manufacturing a multi-layered sheet includes forming an IR blocking layer by coating one surface of a substrate with a composition for forming an IR blocking layer including a CLC material, and forming a UV blocking layer by coating the IR blocking layer with a composition for forming a UV blocking layer including a fluorine-based polymer and a wavelength conversion material.

Hereinafter, the method of manufacturing a multi-layered sheet according to the present invention will be described in further detail.

In order to form an IR blocking layer according to the present invention, first, a composition for forming an IR blocking layer including a CLC material is prepared.

The CLC material may be polymerized by preparing a liquid crystal mixture by mixing 75 parts by weight to 99 parts by weight of the nematic liquid crystal compound and 1 part by weight to 25 parts by weight of the chiral compound, and mixing 0.05 parts by weight to 20 parts by weight of a polymerization initiator based on 100 parts by weight of the liquid crystal mixture. When the content of the polymerization initiator is less than 0.05 parts by weight, the composition for forming an IR blocking layer may be poorly cured, whereas spots may be generated due to poor liquid crystal orientation when the content of the polymerization initiator exceeds 20 parts by weight.

Kinds of the polymerization initiator are not particularly limited. However, polymerization initiators typically known in the art may be used without limitation as long as they are compatible with the liquid crystal mixture. According to the present invention, 2-methyl-1-[4-(methylthio)phenyl]-2-(4-morpholinyl)-1-propanone, 2-methoxy-1,2-diphenylethan-1-one, 1-hydroxy-cyclohexyl-phenyl-ketone, triaryl sulfonium hexafluoroantimonate salt and diphenyl(2,4,6-trimethylbenzoyl)-phosphine oxide may be, for example, used as the polymerization initiator, but the present invention is not limited thereto.

As described above, the composition for forming an IR blocking layer may be prepared by preparing a CLC material and dissolving the CLC material in a proper solvent.

The composition for forming an IR blocking layer may further include a heat stabilizer or UV stabilizer in addition to the CLC material. Here, the contents and kinds of the heat stabilizer or UV stabilizer have been described above.

One surface of a substrate may be coated with the composition for forming an IR blocking layer, and an IR blocking layer may then be formed on one surface of the substrate using a proper curing process. However, after one surface of the substrate is coated with the IR blocking layer, a solvent may be completely removed by drying the composition at a temperature of 80° C. to 120° C., or 90° C. to 110° C., for 10 seconds to 60 seconds, or 15 seconds to 30 seconds, before performing a curing process.

A method of coating one surface of a substrate with the composition for forming an IR blocking layer is not particularly limited. However, methods typically known in the art may be used without limitation. For example, one surface of the substrate may be coated with the composition for forming an IR blocking layer using a bar coater, a roll coater, a reverse roll coater, a knife coater or a knife reverse roll coater, but the present invention is not limited thereto.

The curing process is not particularly limited, but a coating layer may be, for example, cured by irradiation with UVs.

According to another illustrative embodiment of the present invention, the curing process of the IR blocking layer may include the following two operations:

a) forming a concentration gradient of the chiral compound by coating a composition for forming an IR blocking layer including a nematic liquid crystal compound and a chiral compound and irradiating the composition with UVs at a light quantity of 10 mJ/cm$^2$ to 500 mJ/cm$^2$; and b) curing a coating layer in which the concentration gradient of the chiral compound is formed.

That is, in the manufacturing method, the operation of coating a composition for forming an IR blocking layer and forming an IR blocking layer may, for example, include forming a concentration gradient of a chiral compound in a coating layer of the composition for forming an IR blocking layer by irradiating the coating layer with UVs; and curing the coating layer in which the concentration gradient of the chiral compound is formed.

When the coating layer of the composition for forming an IR blocking layer is irradiated at a predetermined temperature with UVs having a relatively weak intensity, a concentration gradient of the chiral compound may be formed in the coating layer, that is, a change in concentration of the chiral compound may be induced in the coating layer in a predetermined direction. According to one illustrative embodiment, the concentration gradient of the chiral compound may be formed in a vertical direction of the coating layer. For example, irradiation with UVs for forming a concentration gradient of the chiral compound may be performed at a temperature of 40° C. to 80° C., 50° C. to 70° C., or approximately 60° C. for approximately 1 second to 10 minutes, or approximately 30 seconds to 1 minute. Also, the irradiation with UVs for forming a concentration gradient of the chiral compound may be performed by irradiation with UVs of a UVA region at a light quantity of approximately 10 mJ/cm$^2$ to 500 mJ/cm$^2$.

After the concentration gradient is formed in the manner as described above, an IR blocking layer may be formed by irradiating the composition with a sufficient quantity of UVs to polymerize components of the composition. The coating layer may be fixed by the irradiation with UVs in a state where a liquid crystal compound has different pitches along the formed concentration gradient of the chiral compound. Conditions for irradiation with strong UVs are not particularly limited as long as the components of the composition may be sufficiently polymerized under these conditions. According to one illustrative embodiment, the irradiation with UVs may be performed by irradiation with UVs of UVA to UVC regions at a light quantity of approximately 1 J/cm$^2$ to 10 J/cm$^2$.

An IR blocking layer having a wide band property at a large wavelength width may be effectively formed using the above-described method.

According to other illustrative embodiments of the present invention, the IR blocking layer may be formed in a single-layer structure or a multi-layered structure of two or more layers. When the IR blocking layer is to be formed in a multi-layered structure of two or more layers, different kinds of the CLC materials may be included in each IR blocking layer, for example, different contents of the nematic liquid crystal compound and the chiral compound may be used to prepare each composition for forming an IR blocking layer. Then, a first IR blocking layer may be formed by coating one surface of a substrate with the composition for forming an IR blocking layer prepared in the above-described method, and an IR blocking layer having a multi-layered structure of two or more layers may be formed by repeatedly performing the coating method on the first IR blocking layer to form a second IR blocking layer and a third IR blocking layer.

In the method of manufacturing a multi-layered sheet according to the present invention, a UV blocking layer may be formed by coating the IR blocking layer formed on one surface of the substrate with a composition for forming a UV blocking layer including a fluorine-based polymer and a wavelength conversion material.

In order to form the UV blocking layer according to the present invention, first, a composition for forming a UV blocking layer is prepared. The composition for forming a UV blocking layer may be prepared by dispersing a fluorine-based polymer and a wavelength conversion material in a solvent and stirring the resulting mixture to homogenously disperse the wavelength conversion material.

The composition for forming a UV blocking layer may further include fine particles or a UV absorbent. Detailed description of the fluorine-based polymer, the wavelength conversion material, the fine particles and the UV absorbent included in the composition for forming a UV blocking layer has been described above.

After the IR blocking layer is coated with the composition for forming a UV blocking layer prepared thus, a UV blocking layer may be formed on the IR blocking layer using a proper drying process. A method of coating the IR blocking layer with the composition for forming a UV blocking layer is not particularly limited. However, various methods typically known in the art may be used without limitation. According to the present invention, the IR blocking layer may be, for example, coated with the composition for forming a UV blocking layer using a bar coater, but the present invention is not limited thereto.

The drying process is not particularly limited. For example, the coating layer may be properly dried by subjecting the coating layer to a heating, drying or aging process.

The method of manufacturing a multi-layered sheet according to the present invention may further include forming a pressure-sensitive adhesive layer by coating the other surface of the substrate with a pressure-sensitive adhesive composition including a pressure-sensitive adhesive resin and transparent inorganic particles.

In order to form the pressure-sensitive adhesive layer according to the present invention, first, a pressure-sensitive adhesive composition is prepared. The pressure-sensitive adhesive composition may be prepared by dissolving a pressure-sensitive adhesive resin and transparent inorganic particles in a solvent and stirring the resulting mixture to homogenously disperse the transparent inorganic particles. The pressure-sensitive adhesive composition may further include a heat stabilizer or UV stabilizer in addition to the pressure-sensitive adhesive resin and the transparent inorganic particles. Detailed description of the pressure-sensitive adhesive resin, the transparent inorganic particles, the heat stabilizer and the UV stabilizer included in the pressure-sensitive adhesive composition has been described above.

After the other surface of the substrate is coated with the pressure-sensitive adhesive composition prepared thus, a pressure-sensitive adhesive layer may be formed on the other surface of the substrate using a proper curing process. A method of coating the IR blocking layer with the pressure-sensitive adhesive composition is not particularly limited. However, various methods typically known in the art may be used without limitation. According to the present invention, the other surface of the substrate may be, for example, coated with the pressure-sensitive adhesive composition using a bar coater, but the present invention is not limited thereto.

As described above, the front sheet of solar cell may effectively block IRs so that the power generation efficiency of a cell can be improved by suppressing an increase in temperature of the cell, the excellent weather resistance can be maintained by blocking UVs, and the power generation efficiency of the cell can be improved by converting wavelengths of a UV region into wavelengths of a VR region.

Figure 3:
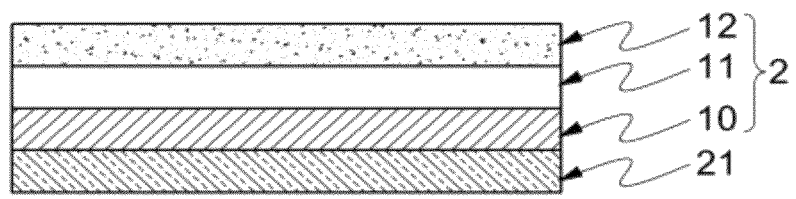
FIGS. 3 and 4 are cross-sectional views showing a front sheet of solar cell according to one illustrative embodiment of the present invention.
Figure 4:
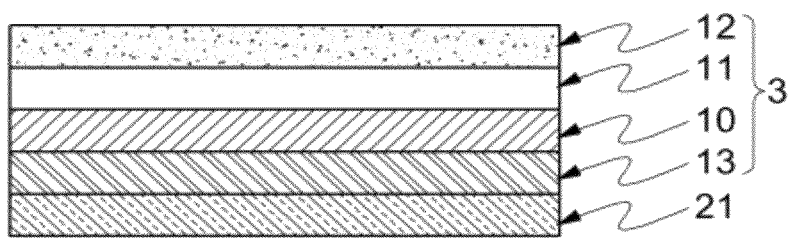

More particularly, FIGS. 3 and 4 are cross-sectional view showing a front sheet of solar cell according to one illustrative embodiment of the present invention which is attached to a front substrate.

As shown in FIG. 3, the front sheet 2 for solar cells according to the present invention may be stacked on a front substrate 21 so that a substrate 10, an IR blocking layer 11 and a UV blocking layer 12 can be sequentially stacked.

As shown in FIG. 4, the front sheet 3 for solar cells according to the present invention may also be stacked on a front substrate 21 so that a pressure-sensitive adhesive layer 13, a substrate 10, an IR blocking layer 11 and a UV blocking layer 12 can be sequentially stacked.

According to the present invention, kinds of the front substrate arranged in a lower portion of the front sheet are not particularly limited as long as the front substrate has excellent optical transmittance, electric insulation property or mechanical, physical or chemical intensity. For example, a glass plate, a fluorine-based resin sheet, a cyclic polyolefin-based resin sheet, a polycarbonate-based resin sheet, a poly (meth)acryl-based resin sheet, a polyamide-based resin sheet or a polyester-based resin sheet may be used as the front substrate. According to one illustrative embodiment of the present invention, a glass plate having excellent heat resistance may be used, but the present invention is not limited thereto.

Also, the present invention is directed to providing a photovoltaic module including the above-described front sheet of solar cell according to the present invention.

A structure of the photovoltaic module according to the present invention is not particularly limited as long as the photovoltaic module includes the front sheet for solar cells. Various structures of the photovoltaic module widely known in the art may be selected and used without limitation.

According to the present invention, for example, a structure of the photovoltaic module may include a backsheet, a photovoltaic cell or photovoltaic cell array formed on the backsheet, a front substrate formed on the photovoltaic cell or photovoltaic cell array, a front sheet formed on the front substrate, and an encapsulant layer for encapsulating the photovoltaic cell or photovoltaic cell array between the backsheet and the front substrate. In this case, the front sheet may be the outermost surface of the UV blocking layer, and the substrate may be attached to the front substrate by means of the pressure-sensitive adhesive layer.

Kinds of the backsheet that may be used herein are not particularly limited. Here, backsheets typically known in the art may be used without limitation. Typically, the backsheet that may be used herein may include a metal plate or metal foil such as aluminum; a fluorine-based polymer sheet; a cyclic polyolefin-based polymer sheet; a polycarbonate-based polymer sheet; an acrylic polymer sheet; a polyamide-based polymer sheet; a sheet having weather resistance, such as a polyester-based polymer sheet; or a stacked sheet of at least two thereof or a complex sheet obtained by stacking the above-described sheet and a barrier film, but the present invention is not limited thereto. According to the present invention, a thickness of the backsheet is not particularly limited, but may be adjusted to a typical thickness range.

Specific kinds of the photovoltaic cell formed on the backsheet are not particularly limited as long as they can serve to cause a photoelectromotive force. Thus, a photovoltaic element that may be generally used in the art may be used for the photovoltaic cell. For example, a crystalline silicon photovoltaic cell made of monocrystalline silicon or polycrystalline silicon, an amorphous silicon photovoltaic cell such as a single binding type or tandem structure type, a Group III-V compound semiconductor photovoltaic cell made of gallium-arsenic (GaAs) or indium-phosphorus (InP), and a Group II-VI compound semiconductor photovoltaic cell made of cadmium-tellurium (CdTe) or copper-indium-selenide ($CuJnSe_2$) may be used as the photovoltaic cell. Also, a thin-film polycrystalline silicon photovoltaic cell, a thin-film microcrystalline silicon photovoltaic cell, and a hybrid photovoltaic cell made of thin-film crystalline silicon and amorphous silicon may be used as the photovoltaic cell.

The photovoltaic cell may form a photovoltaic cell array (a photovoltaic cell assembly) by means of a wire to connect the photovoltaic cells. When sunlight shines on the photovoltaic module according to the present invention, electrons (−) and holes (+) are generated inside the photovoltaic cell so that an electric current can flow through the wire connecting the photovoltaic cells.

According to the present invention, a transparent front substrate may be used as the front substrate formed on the photovoltaic cell or photovoltaic cell array so that sunlight can be incident to the photovoltaic cell. Also, the front substrate may serve to protect the inside of the photovoltaic module from wind, rain, external shocks or fire.

According to the present invention, the front sheet arranged in an upper portion of the front substrate may serve to protect the inside of the photovoltaic module from wind, rain or fire and secure long-term reliability when the photovoltaic module is exposed to outdoor environments. According to the present invention, the above-described front sheet may be used to suppress an increase in temperature of a cell by effectively blocking IRs. Also, the power generation efficiency and weather resistance of the cell may be improved by converting UVs into VRs. Here, a thickness of the front sheet is not particularly limited, but may be adjusted to a typical thickness range.

According to the present invention, an encapsulant generally known in the art may be used without limitation for the encapsulant layer for encapsulating the photovoltaic cell or photovoltaic cell array in the inside of the photovoltaic module, more particularly between the backsheet and the front substrate.

Figure 5:
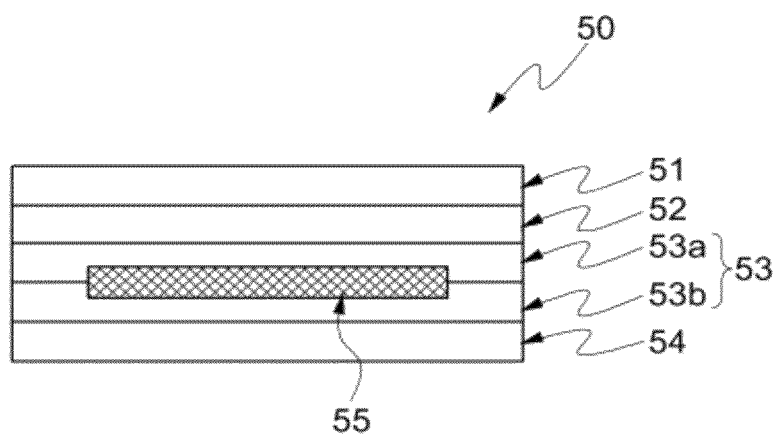
FIGS. 5 and 6 are cross-sectional views showing a photovoltaic module according to one illustrative embodiment of the present invention.
Figure 6:
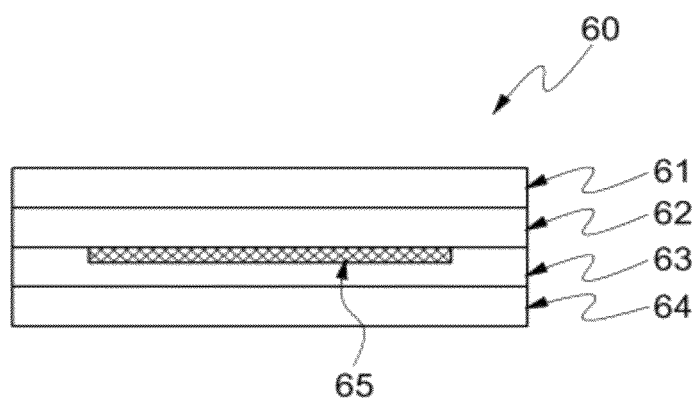

FIGS. 5 and 6 are cross-sectional views showing a photovoltaic module according to one illustrative embodiment of the present invention.

FIG. 5 shows one example of a wafer-based photovoltaic module 50 including a front sheet for photovoltaic modules according to the present invention. As shown in FIG. 5, the photovoltaic module 50 according to one illustrative embodiment of the present invention may include a front sheet 51 for photovoltaic modules according to the present invention, a front substrate 52, a backsheet 54, a photovoltaic element 55 such as the silicon-based wafer, and an encapsulant layer 53 for encapsulating the photovoltaic element 55. In this case, the encapsulant layer 53 may include a first layer 53a attached to the front substrate 52 while encapsulating the photovoltaic element 55, and a second layer 53b attached to the backsheet 54 while encapsulating the photovoltaic element 55. The first and second layers constituting the encapsulant layer 53 may be formed of materials widely known in the art, as previously described above.

FIG. 6 is a cross-sectional view showing a thin-film photovoltaic module 60 according to another illustrative embodiment of the present invention. In the case of the thin-film photovoltaic module 60, a photovoltaic element 65 may be generally formed in a lower portion of a front substrate 62 to which a front sheet 61 for photovoltaic modules according to the present invention is attached, as shown in FIG. 6. Such a thin-film photovoltaic element 65 may be generally deposited using a method such as chemical vapor deposition (CVD). Like the photovoltaic module 50 as shown in FIG. 5, the photovoltaic module 60 as shown in FIG. 3 includes an encapsulant layer 63 and a backsheet 64, and the encapsulant layer 63 may be formed in a single layer. Detailed description of the encapsulant layer 63 and the backsheet 64 have been described above.

According to the present invention, a method of manufacturing such a photovoltaic module is not particularly limited, and the photovoltaic module may be manufactured using various methods known in the art without limitation.

The photovoltaic module as shown in FIGS. 5 and 6 is merely one of the various illustrative embodiments of the photovoltaic module according to the present invention. As long as the photovoltaic module includes a backsheet for the photovoltaic module according to the present invention, the structure of the photovoltaic module, and the kind and size of materials constituting the photovoltaic module are not particularly limited. Thus, photovoltaic modules widely known in the art may be used without limitation.

EXAMPLES

Hereinafter, the present invention will be described in further detail with reference to Examples according to the present invention and Comparative Examples not according to the present invention, but the scope of the present invention will not be limited to the following Examples.

Preparative Example 1

Preparation of Composition (1) for Forming IR Blocking Layer

A liquid crystal mixture was prepared by mixing 1 part by weight of a chiral compound, Paliocolor LC 756 (commercially available from BASF), and 99 parts by weight of a nematic liquid crystal compound, Paliocolor LC 242 (commercially available from BASF). Thereafter, 3 parts by weight of a polymerization inhibitor, Irgacure 907 (commercially available from Ciba Specialty Chemicals), was mixed based on 100 parts by weight of the liquid crystal mixture, and then dissolved in a solvent, 1,3-dioxolane to prepare a composition (1) for forming an IR blocking layer.

Preparative Example 2

Preparation of Composition (2) for Forming IR Blocking Layer

A composition (2) for forming an IR blocking layer was prepared in the same manner as in Preparative Example 1, except that 98.5 parts by weight of Paliocolor LC 242 (commercially available from BASF) and 1.5 parts by weight of Paliocolor LC 756 (commercially available from BASF) were mixed to prepare a liquid crystal mixture.

Preparative Example 3

Preparation of Composition (3) for Forming IR Blocking Layer

A composition (3) for forming an IR blocking layer was prepared in the same method as in Preparative Example 1, except that 98 parts by weight of Paliocolor LC 242 (commercially available from BASF) and 2 parts by weight of Paliocolor LC 756 (commercially available from BASF) were mixed to prepare a liquid crystal mixture.

Preparative Example 4

Preparation of Fluorine-Based Polymer

A fluorine-based polymer was prepared as listed in the following Table 1 in order to prepare a composition for forming a UV blocking layer including a fluorine-based polymer and a wavelength conversion material. A monomer component, a weight average molecular weight and a melting point of the fluorine-based polymer are listed in the following Table 1.

TABLE 1

| Fluorine-based Polymer | Monomer Ratio (Weight Ratio) | Weight Average Molecular Weight ($M_w$) | Melting Point (° C.) |
| --- | --- | --- | --- |
| VDF-HFP Copolymer | 85:15 (VDF:HFP) | 300,000 | 132 |

VDF: Vinylidene fluoride
HFP: Hexafluoropropylene

Preparative Example 5

Preparation of Composition (a) for Forming UV Blocking Layer

A first coating solution was prepared by pre-dissolving 100 g of the fluorine-based polymer (a copolymer including VDF and HFP at a weight ratio of 85:15 (VDF:HFP) in a polymerized form) prepared from Preparative Example 4 in 400 g of a solvent, MEK.

Regardless of the preparation of the first coating solution, 10 g of a fluorescent material, $La_2O_2S:Eu$, was dispersed in 90 g of MEK, and 50 g of zirconia beads having a diameter of 0.3 mm was further added. Thereafter, the resulting mixture was stirred at a rate of 1,000 rpm for 1 hour, and the zirconia beads were then completely removed to prepare 100 g of a mill base dispersion.

50 g of the prepared mill base dispersion (including 5 g of $La_2O_2S:Eu$) was added to a pre-prepared first coating solution and then stirred again to prepare a composition (a) for forming a UV blocking layer.

Preparative Example 8

Preparation of Pressure-Sensitive Adhesive Composition 100 parts by weight of silicon-based resin (Dow Corning 282) and 5 parts by weight of zinc oxide fine particles (average particle size: 10 nm) were dissolved in a solvent, toluene, and then stirred to homogenously disperse the zinc oxide fine particles, thereby preparing a pressure-sensitive adhesive composition.

Example 1

Formation of IR Blocking Layer

The composition (1) for forming an IR blocking layer was applied onto one surface of a PET film that was a substrate using a roll coater. More particularly, a coating was performed by controlling such intervals that a thickness after drying could amount to approximately 3 µm. Then, the coated substrate was dried in an oven at a temperature of 100° C. for 15 seconds to completely remove the solvent included in the composition for forming an IR blocking layer. Thereafter, the coated substrate was irradiated with UVs for 5 minutes to form an IR blocking layer including a cholesteric liquid crystal material.

Formation of UV Blocking Layer

The composition (a) for forming a UV blocking layer prepared in Preparative Example 5 was applied onto the IR blocking layer formed on one surface of the prepared PET film using a comma reverse method. More particularly, a coating was performed by controlling such intervals that a thickness after drying could amount to approximately 20 µm. Then, the coated substrate was sequentially passed through three ovens, a length of each of which was 2 m, and temperatures of which were 80° C., 140° C. and 140° C., to prepare a UV blocking layer.

Formation of Pressure-Sensitive Adhesive Layer

For a stacked body in which a substrate, an IR blocking layer and a UV blocking layer are sequentially stacked, the pressure-sensitive adhesive composition prepared in Preparative Example 8 was applied onto the other surface of the substrate using a roll coater, as described above. More particularly, coating was performed by controlling such intervals that a thickness after drying could amount to approximately 20 μm. Then, the coated substrate was dried in an oven at a temperature of 100° C. for 10 minutes to form a pressure-sensitive adhesive layer, thereby completing a multi-layered sheet.

Example 2

A multi-layered sheet was completed in the same manner as in Example 1, except that coating was performed so that a thickness of the UV blocking layer could amount to 4 μm during formation of the IR blocking layer.

Example 3

A multi-layered sheet was completed in the same manner as in Example 1, except that coating was performed so that a thickness of the IR blocking layer could amount to 5 μm during formation of the IR blocking layer.

Example 4

A multi-layered sheet was completed in the same manner as in Example 1, except that the composition (2) for forming an IR blocking layer was applied onto one surface of a PET film that was a substrate using a roll coater during formation of the IR blocking layer.

Example 5

A multi-layered sheet was completed in the same manner as in Example 4, except that coating was performed so that a thickness of the IR blocking layer could amount to 4 μm during formation of the IR blocking layer.

Example 6

A multi-layered sheet was completed in the same manner as in Example 4, except that coating was performed so that a thickness of the IR blocking layer could amount to 5 μm during formation of the IR blocking layer.

Example 7

A multi-layered sheet was prepared in the same manner as in Example 1, except that the composition (3) for forming an IR blocking layer was applied onto one surface of a PET film that was a substrate using a roll coater during formation of the IR blocking layer.

Example 8

A multi-layered sheet was completed in the same manner as in Example 7, except that coating was performed so that a thickness of the IR blocking layer could amount to 4 μm during formation of the IR blocking layer.

Example 9

A multi-layered sheet was completed in the same manner as in Example 7, except that coating was performed so that a thickness of the IR blocking layer could amount to 5 μm during formation of the IR blocking layer.

Example 10

A multi-layered sheet was completed in the same manner as in Example 1, except that an IR blocking layer having a three-layered structure was formed in the following method during formation of the IR blocking layer.

Formation of IR Blocking Layer

The composition (1) for forming an IR blocking layer was applied onto one surface of a PET film that was a substrate using a roll coater. More particularly, coating was performed by controlling such intervals that a thickness after drying could amount to approximately 4 μm. Then, the coated substrate was dried in an oven at a temperature of 100° C. for 15 seconds to completely remove the solvent included in the composition for forming an IR blocking layer. Thereafter, the coated substrate was irradiated with UVs for 5 minutes to prepare a first IR blocking layer.

Next, the composition (2) for forming an IR blocking layer was applied onto the first IR blocking layer using a roll coater. More particularly, coating was performed by controlling such intervals that a thickness after drying could amount to approximately 4 μm. Then, the coated substrate was dried in an oven at a temperature of 100° C. for 15 seconds to completely remove the solvent included in the composition for forming an IR blocking layer. Thereafter, the coated substrate was irradiated with UVs for 5 minutes to prepare a second IR blocking layer.

Subsequently, the composition (3) for forming an IR blocking layer was applied onto the second IR blocking layer using a roll coater. More particularly, coating was performed by controlling such intervals that a thickness after drying could amount to approximately 3 μm. Then, the coated substrate was dried in an oven t a temperature of 100° C. for 15 seconds to completely remove the solvent included in the composition for forming an IR blocking layer. Thereafter, the coated substrate was irradiated with UVs for 5 minutes to prepare a third IR blocking layer.

Comparative Example 1

A multi-layered sheet was completed in the same manner as in Example 1, except that the IR blocking layer was not formed.

Experimental Example 1

The multi-layered sheets prepared in Examples 1 to 12 and Comparative Examples 1 to 3 were vertically irradiated with sunlight through the UV blocking layer, and measured for reflexibility at each wavelength region. The reflexibility was measured according to the following Equation 1.

$$\text{Reflexibility } (R) = \text{Reflection Quantity/Incident Quantity} \times 100 (\%) \quad \text{Equation 1}$$

Figure 7:
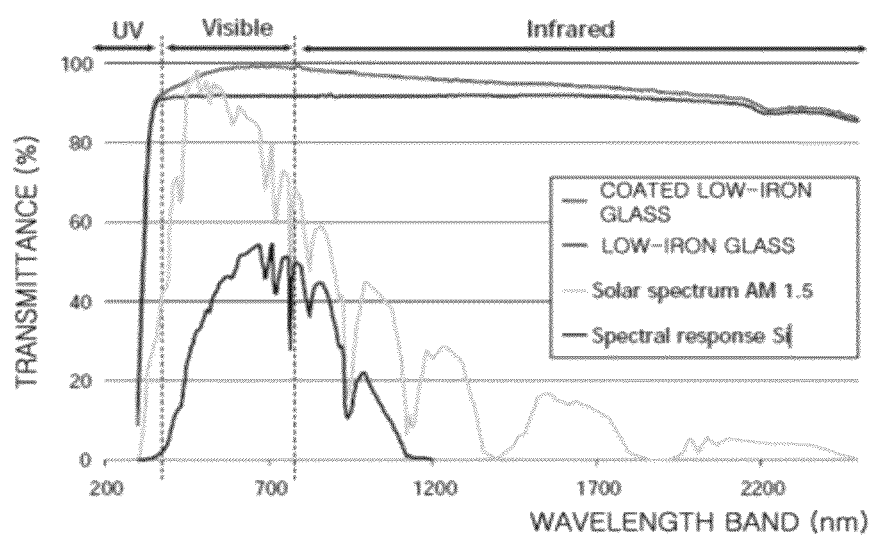
FIG. 7 is a graph illustrating the spectra of sunlight at a middle latitude zone and the spectral response of a crystalline silicon photovoltaic cell to the sunlight.

FIG. 7 is a graph illustrating the spectra of sunlight at a middle latitude zone and the spectral response of a crystalline silicon photovoltaic cell to the sunlight. As shown in FIG. 7, the crystalline silicon photovoltaic cell hardly used light of an IR region having a wavelength of 1,200 nm or more, and the wavelengths of the IR region contributed only to an increase in temperature of a cell to reduce power generation efficiency of the cell. Thus, it is necessary to effectively block the wavelengths of the IR region.

Figure 8:
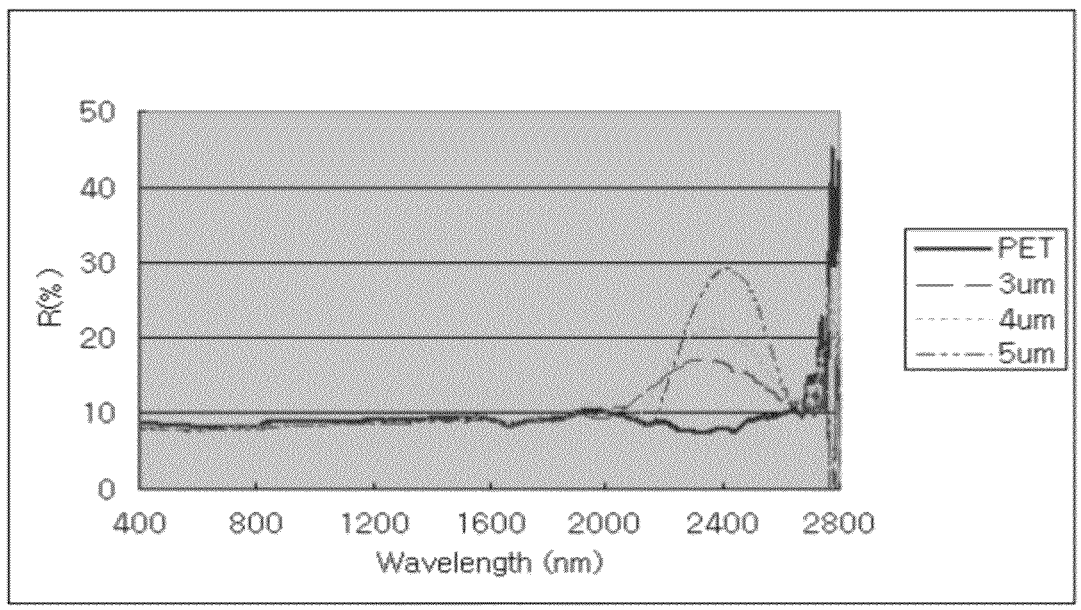
FIG. 8 is a graph illustrating the changes in reflexibility at each wavelength region with respect to multi-layered sheets prepared in Comparative Example 1 and Examples 1 to 3 of the present invention.

FIG. 8 is a graph illustrating the changes in reflexibility at each wavelength region with respect to multi-layered sheets prepared in Comparative Example 1 and Examples 1 to 3 of the present invention. As described in Comparative Example 1 (PET), when the multi-layered sheet did not have an IR blocking layer including a cholesteric liquid crystal material, the multi-layered sheet did not exhibit an effect of blocking light of a certain wavelength region. Meanwhile, in the case of Examples 1 to 3 in which the IR blocking layer, which included the cholesteric liquid crystal material including 99 parts by weight of the nematic liquid crystal compound and 1 part by weight of the chiral compound, was formed, the multi-layered sheets exhibited an effect of blocking light of a certain wavelength region (approximately 2,000 nm to approximately 2,650 nm). In particular, in the case of Example 3 in which the IR blocking layer had a thickness of 5 μm, the multi-layered sheet had a higher IR reflexibility than that of Example 1 in which the IR blocking layer had a thickness of 3 μm.

Figure 9:
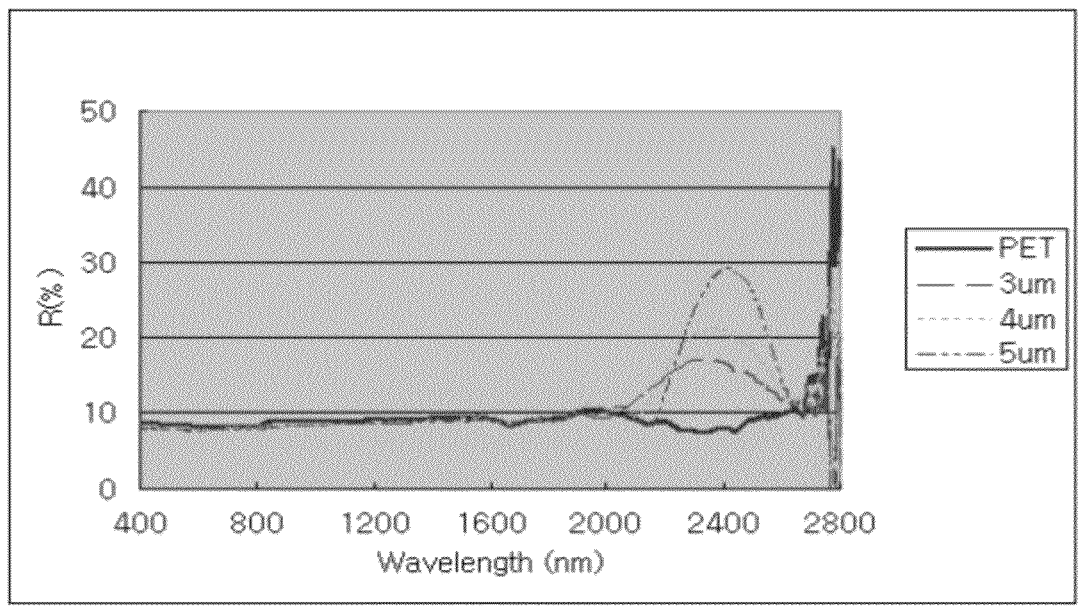
FIG. 9 is a graph illustrating the changes in reflexibility at each wavelength region with respect to multi-layered sheets prepared in Comparative Example 1 and Examples 4 to 6 of the present invention.

FIG. 9 is a graph illustrating the changes in reflexibility at each wavelength region with respect to multi-layered sheets prepared in Comparative Example 1 and Examples 4 to 6 of the present invention. As described in Comparative Example 1 (PET), when the multi-layered sheet did not have the IR blocking layer including a cholesteric liquid crystal material, the multi-layered sheet did not exhibit an effect of blocking light of a certain wavelength region. Meanwhile, in the case of Examples 4 to 6 in which the IR blocking layer, which included the cholesteric liquid crystal material including 98.5 parts by weight of the nematic liquid crystal compound and 1.5 parts by weight of the chiral compound, was formed, the multi-layered sheets exhibited an effect of blocking light of a certain wavelength region (approximately 1,400 nm to approximately 1,800 nm). In particular, in the case of Example 6 in which the IR blocking layer had a thickness of 5 μm, the multi-layered sheet had a higher IR reflexibility than that of Example 4 in which the IR blocking layer had a thickness of 3 μm.

Figure 10:
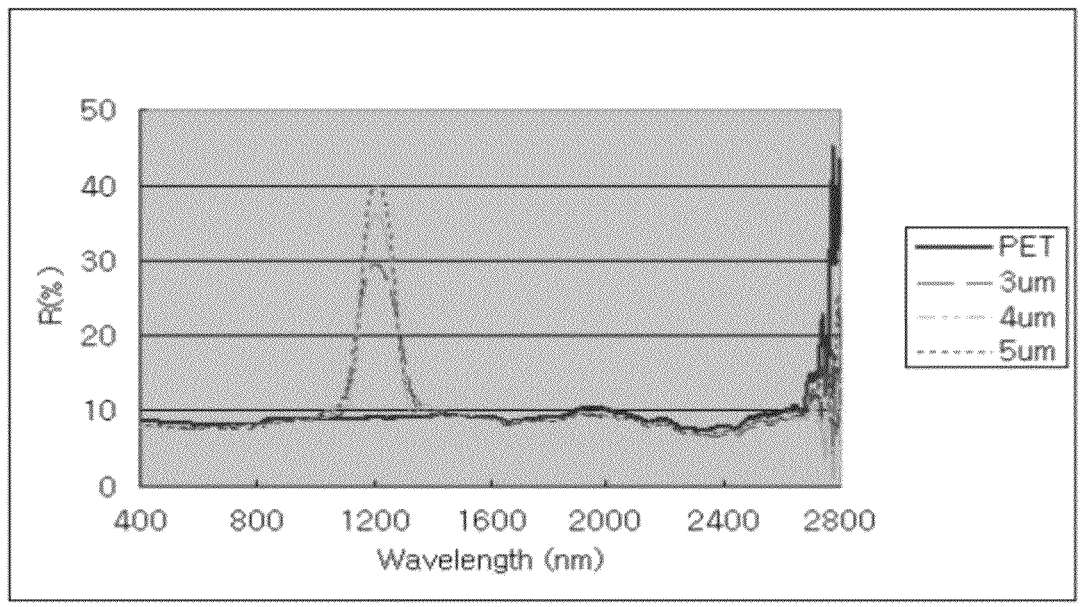
FIG. 10 is a graph illustrating the changes in reflexibility at each wavelength region with respect to multi-layered sheets prepared in Comparative Example 1 and Examples 7 to 9 of the present invention.

FIG. 10 is a graph illustrating the changes in reflexibility at each wavelength region with respect to multi-layered sheets prepared in Comparative Example 1 and Examples 7 to 9 of the present invention. As described in Comparative Example 1 (PET), when the multi-layered sheet did not have the IR blocking layer including a cholesteric liquid crystal material, the multi-layered sheet did not exhibit an effect of blocking light of a certain wavelength region. Meanwhile, in the case of Examples 7 to 9 in which the IR blocking layer, which included the cholesteric liquid crystal material including 98 parts by weight of the nematic liquid crystal compound and 2 parts by weight of the chiral compound, was formed, the multi-layered sheets exhibited an effect of blocking light of a certain wavelength region (approximately 1,000 nm to approximately 1,400 nm). In particular, in the case of Example 9 in which the IR blocking layer had a thickness of 5 μm, the multi-layered sheet had a higher IR reflexibility than that of Example 7 in which the IR blocking layer had a thickness of 3 μm.

Figure 11:
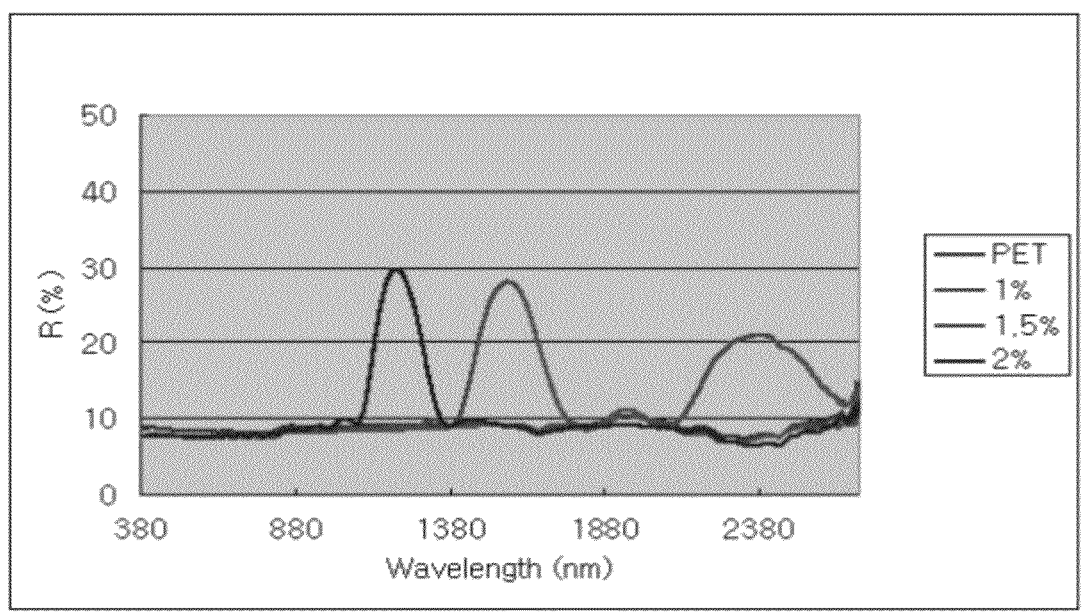
FIG. 11 is a graph illustrating the changes in reflexibility at each wavelength region with respect to multi-layered sheets prepared in Comparative Example 1 and Example 10 of the present invention.

FIG. 11 is a graph illustrating the changes in reflexibility at each wavelength region with respect to multi-layered sheets prepared in Comparative Example 1 and Example 10 of the present invention. As described in Comparative Example 1 (PET), when the multi-layered sheet did not have the IR blocking layer including a cholesteric liquid crystal material, the multi-layered sheet did not exhibit an effect of blocking light of a certain wavelength region. Meanwhile, in the case of Example 10 in which the IR blocking layer having a three-layered structure including the cholesteric liquid crystal material including different contents of the nematic liquid crystal compound and the chiral compound, the multi-layered sheet exhibited an effect of blocking light of a certain wavelength region with respect to each IR blocking layer. That is, the first IR blocking layer including the cholesteric liquid crystal material including 99 parts by weight of the nematic liquid crystal compound and 1 part by weight of the chiral compound exhibited an effect of blocking light having a wavelength region of approximately 2,000 nm to approximately 2,650 nm. Also, the second IR blocking layer including the cholesteric liquid crystal material including 98.5 parts by weight of the nematic liquid crystal compound and 1.5 parts by weight of the chiral compound exhibited an effect of blocking light having a wavelength region of approximately 1,400 nm to approximately 1,800 nm. In addition, the third IR blocking layer including the cholesteric liquid crystal material including 98 parts by weight of the nematic liquid crystal compound and 2 parts by weight of the chiral compound exhibited an effect of blocking light having a wavelength region of approximately 1,000 nm to approximately 1,400 nm.

As described above, the multi-layered sheet according to the present invention can block IRs of different certain wavelength regions through changes in contents of the nematic liquid crystal compound and the chiral compound that constitute the cholesteric liquid crystal material included in the IR blocking layer. In particular, an IR blocking efficiency (reflexibility) can be controlled under the control of a thickness of the IR blocking layer.

The present invention may provide a front sheet of solar cell capable of effectively blocking IRs by forming an IR blocking layer including a cholesteric liquid crystal (CLC) material on a substrate. Thus, an increase in temperature of a cell can be suppressed so that the power generation efficiency of the cell can be improved. In particular, the content of the chiral compound included in the CLC material can be controlled so that IRs having a wavelength of 1,000 nm to 2,650 nm can be blocked. Also, the multi-layered sheet can be configured so that a UV blocking layer including a fluorine-based polymer and a wavelength conversion material can be formed on the IR blocking layer. Thus, wavelengths of a UV region can be converted into wavelengths of a VR region so that the power generation efficiency of the cell can be improved, and discoloration and deformation caused by UVs can be prevented so that the weather resistance can be improved.

While the invention has been shown and described with reference to certain illustrative embodiments thereof, it will be understood by those skilled in the art that various changes in form and details may be made therein without departing from the scope of the invention as defined by the appended claims.

What is claimed is:

1. A front sheet of a solar cell comprising:
   a substrate;
   an infrared ray (IR) blocking layer formed on one surface of the substrate and including a cholesteric liquid crystal (CLC) material; and
   an ultraviolet ray (UV) blocking layer formed on the IR blocking layer and including a fluorine-based polymer and a wavelength conversion material, wherein the wavelength conversion material converts light in the UV region into light in the visible region, and wherein the IR blocking layer blocks IRs having a wavelength of 1,000 nm to 2,650 nm,
   wherein the CLC material comprises 98 parts by weight to 99 parts by weight of the nematic liquid crystal compound; and 1 part by weight to 2 parts by weight of the chiral compound; and
   wherein the CLC material selectively reflects light having a selective reflection center wavelength of 1,000 nm to 2,650 nm.

2. The front sheet of a solar cell of claim 1, wherein the substrate is a polyethylene terephthalate (PET) film, a poly (meth)acryl film, a polyvinylidene chloride (PVDC) film or a polyvinyl chloride (PVC) film.

3. The front sheet of a solar cell of claim 1, wherein the CLC material comprises a compound represented by the following Formula 1 in a cross-linked or polymerized form:

Formula 1

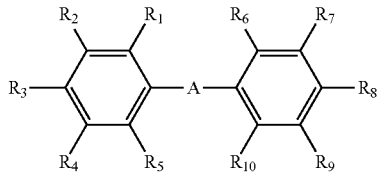

wherein A is a single bond, —COO— or —OCO—, $R_1$ to $R_{10}$ each independently represent hydrogen, a halogen, an alkyl group, an alkoxy group, a cyano group, a nitro group, —O-Q-P or a substituent represented by the following Formula 2, provided that at least one of $R_1$ to $R_{10}$ is —O-Q-P or a substituent of the following Formula 2, Q is an alkylene group or an alkylidene group, and P is an alkenyl group, an epoxy group, a cyano group, a carboxyl group, an acryloyl group, a (meth)acryloyl group, an acryloyloxy group or a (meth)acryloyloxy group:

Formula 2

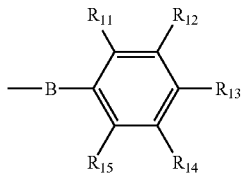

wherein B is a single bond, —COO— or —OCO—, $R_{11}$ to $R_{15}$ each independently represent hydrogen, a halogen, an alkyl group, an alkoxy group, a cyano group, a nitro group or —O-Q-P, provided that at least one of $R_{11}$ to $R_{15}$ is —O-Q-P, Q is an alkylene group or an alkylidene group, and P is an alkenyl group, an epoxy group, a cyano group, a carboxyl group, an acryloyl group, a (meth)acryloyl group, an acryloyloxy group or a (meth)acryloyloxy group.

4. The front sheet of a solar cell of claim 1, wherein the IR blocking layer has a concentration gradient of the chiral compound formed in a vertical direction thereof, and a reflection wavelength width of 200 nm or more.

5. The front sheet of a solar cell of claim 1, wherein the IR blocking layer has a single-layer structure or a multi-layered structure of two or more layers.

6. The front sheet of a solar cell of claim 5, wherein the IR blocking layer comprises different CLC materials in each layer when the IR blocking layer has a multi-layered structure of two or more layers.

7. The front sheet of a solar cell of claim 1, wherein the IR blocking layer further comprises a heat stabilizer or a UV stabilizer.

8. The front sheet of a solar cell of claim 1, wherein the IR blocking layer has a thickness of 1 μm to 50 μm.

9. The front sheet of a solar cell of claim 1, wherein the fluorine-based polymer is a homopolymer, copolymer or a mixture thereof including at least one monomer selected from the group consisting of vinylidene fluoride (VDF), vinyl fluoride (VF), tetrafluoroethylene (TFE) hexafluoropropylene (HFP), chlorotrifluoroethylene (CTFE), trifluoroethylene, hexafluoroisobutylene, perfluorobutyl ethylene, perfluoro (methylvinylether) (PMVE), perfluoro (ethylvinylether) (PEVE), perfluoro (propylvinylether) (PPVE), perfluoro (hexylvinylether) (PHVE), perfluoro-2,2-dimethyl-1,3-dioxol (PDD) and perfluoro-2-methylene-4-methyl-1,3-dioxolane (PMD) in a polymerized form.

10. The front sheet of a solar cell of claim 1, wherein the wavelength conversion material is a fluorescent material that absorbs a short wavelength region of light to emit a long wavelength region of light.

11. The front sheet of a solar cell of claim 10, wherein the short wavelength region is in a range of 300 nm to 400 nm, and the long wavelength region is in a range of 400 nm to 1000 nm.

12. The front sheet of a solar cell of claim 10, wherein the fluorescent material includes a rare earth element as impurities and has a transmittance at a visible ray (VR) region of 85% or more.

13. The front sheet of a solar cell of claim 12, wherein the fluorescent material is at least one selected from the group consisting of $La_2O_2S$:Eu, $(Ba,Sr)_2SiO_4$:Eu and $Sr_5(PO_4)_3Cl$:Eu.

14. The front sheet of a solar cell of claim 10, wherein the fluorescent material has a primary average particle size of 1 nm to 100 nm.

15. The front sheet of a solar cell of claim 14, wherein the UV blocking layer further includes at least one of fine particles selected from the group consisting of zinc oxide, titanium oxide, cerium oxide, zirconium oxide and iron oxide.

16. The front sheet of a solar cell of claim 1, wherein the UV blocking layer has a thickness of 1 μm to 100 μm.

17. A photovoltaic module comprising the front sheet of a solar cell according to claim 1.

* * * * *